United States Patent
Chien et al.

(10) Patent No.: US 12,047,039 B2
(45) Date of Patent: Jul. 23, 2024

(54) ENVELOPE TRACKING SUPPLY MODULATOR USING LINEAR AMPLIFIER WITH SEGMENTED OUTPUT STAGE AND ASSOCIATED WIRELESS COMMUNICATION SYSTEM

(71) Applicant: MEDIATEK INC., Hsin-Chu (TW)

(72) Inventors: Shih-Hsiung Chien, Hsinchu (TW); Chen-Yen Ho, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 494 days.

(21) Appl. No.: 17/358,009

(22) Filed: Jun. 25, 2021

(65) Prior Publication Data

US 2022/0021342 A1 Jan. 20, 2022

Related U.S. Application Data

(60) Provisional application No. 63/051,939, filed on Jul. 15, 2020.

(51) Int. Cl.
 *H03F 1/02* (2006.01)
 *H03F 3/195* (2006.01)
 *H03F 3/24* (2006.01)

(52) U.S. Cl.
 CPC ........... *H03F 1/0227* (2013.01); *H03F 3/195* (2013.01); *H03F 3/245* (2013.01); *H03F 2200/102* (2013.01); *H03F 2200/451* (2013.01)

(58) Field of Classification Search
 CPC ......... H03F 3/245; H03F 3/195; H03F 1/0227
 See application file for complete search history.

(56) References Cited

U.S. PATENT DOCUMENTS 11,133,833 B2 * 9/2021 Dorosenco ............. H03F 3/195
2013/0094553 A1 4/2013 Paek
(Continued)

FOREIGN PATENT DOCUMENTS

CN 110311636 A 10/2019
WO 2018/191967 A1 10/2018

OTHER PUBLICATIONS

Paek, "An RF-PA Supply Modulator Achieving 83% Efficiency and -136dBm/Hz Noise for LTE-40MHz and GSM 35dBm Applications", pp. 354-355 and a page including Figure 20.7.7, ISSCC 2016 / SESSION 20 / RF-to-THz Transceiver Techniques / 20.7, 2016.

*Primary Examiner* — Patricia T Nguyen
(74) *Attorney, Agent, or Firm* — Winston Hsu

(57) ABSTRACT

A linear amplifier of an envelope tracking supply modulator includes a pre-driver stage circuit and an output stage circuit. The pre-driver stage circuit receives an envelope input, and generates a pre-driver output according to the envelope input. The output stage circuit receives the pre-driver output, and generates an amplifier output according to the pre-driver output. The amplifier output is involved in setting a modulated supply voltage of a power amplifier. The output stage circuit has a plurality of amplifiers, including a first amplifier and a second amplifier. When the power amplifier has a first output power level, the first amplifier is involved in setting the amplifier output, and the second amplifier is not involved in setting the amplifier output. When the power amplifier has a second output power level different from the first output power level, the first amplifier and the second amplifier are involved in setting the amplifier output.

21 Claims, 6 Drawing Sheets

(56) References Cited

U.S. PATENT DOCUMENTS

| | | | |
|---|---|---|---|
| 2014/0057684 A1* | 2/2014 | Khlat | H03F 3/505 |
| | | | 455/574 |
| 2014/0087673 A1* | 3/2014 | Mostov | H03F 3/21 |
| | | | 455/78 |
| 2015/0054588 A1 | 2/2015 | Wimpenny | |
| 2015/0188432 A1* | 7/2015 | Vannorsdel | H02M 3/156 |
| | | | 323/271 |
| 2015/0236651 A1 | 8/2015 | Yang | |
| 2017/0359029 A1 | 12/2017 | Nobbe | |
| 2018/0152144 A1 | 5/2018 | Choo | |
| 2020/0028472 A1* | 1/2020 | Scott | H03F 3/20 |
| 2020/0099341 A1* | 3/2020 | Duncan | H03F 1/0233 |
| 2021/0250002 A1* | 8/2021 | Chang | H03F 1/0227 |

\* cited by examiner

ENVELOPE TRACKING SUPPLY MODULATOR USING LINEAR AMPLIFIER WITH SEGMENTED OUTPUT STAGE AND ASSOCIATED WIRELESS COMMUNICATION SYSTEM

CROSS REFERENCE TO RELATED APPLICATIONS

This application claims the benefit of U.S. provisional application No. 63/051,939, filed on Jul. 15, 2020 and incorporated herein by reference.

BACKGROUND

The present invention relates to envelope tracking, and more particularly, to an envelope tracking supply modulator using a linear amplifier with a segmented output stage and an associated wireless communication system.

A power amplifier (PA) is used to amplify a radio-frequency (RF) signal for radio transmission. The PA is commonly found in a wireless communication device for driving antenna(s) of a transmitter. The power consumption of a PA is critical to a wireless communication device that is battery operated. Traditionally, the PA is biased with a fixed supply voltage. Peak RF output power conditions generally occur when the RF input signal input to the PA is at a maximum level. However, when the PA is backed-off from the peak RF output power conditions, the excess input power must be dissipated by the PA because it is not being transformed into useful RF output power. That is, the traditional fixed PA supply voltage results in significant amount of power loss as heat. Envelope tracking is a technique that requires the supply voltage of the PA to be modulated dynamically with the envelope of the RF input signal. This would make the PA operate closer to the peak level at all times and dramatically improve the efficiency of the PA. That is, the envelope tracking technique modulates the PA supply voltage to track the envelope of the RF input signal to reduce the amount of power dissipated as heat.

In wireless communications, bandwidth is the frequency range occupied by a modulated carrier signal. With the advance of wireless communication technology, a wider bandwidth is used by one modulated carrier signal. Hence, a wide bandwidth linear amplifier is needed by an envelope tracking supply modulator that is used to supply a modulated supply voltage to the PA. However, a typical linear amplifier generally consumes large quiescent current for achieving a wide envelope tracking bandwidth. As a result, a typical wide-bandwidth envelope tracking design is power-hungry.

Thus, there is a need for an innovative design which achieves wide-bandwidth envelope tracking with reduced quiescent current consumption.

SUMMARY

One of the objectives of the claimed invention is to provide an envelope tracking supply modulator using a linear amplifier with a segmented output stage and an associated wireless communication system.

According to a first aspect of the present invention, an exemplary envelope tracking supply modulator is disclosed. The exemplary envelope tracking supply modulator includes a linear amplifier. The linear amplifier includes a pre-driver stage circuit and an output stage circuit. The pre-driver stage circuit is arranged to receive an envelope input, and generate a pre-driver output according to the envelope input. The output stage circuit is arranged to receive the pre-driver output, and generate an amplifier output of the linear amplifier according to the pre-driver output, wherein the amplifier output is involved in setting a modulated supply voltage of a power amplifier. The output stage circuit has a plurality of amplifiers, including a first amplifier and a second amplifier. When the power amplifier has a first output power level, the first amplifier is involved in setting the amplifier output, and the second amplifier is not involved in setting the amplifier output. When the power amplifier has a second output power level different from the first output power level, the first amplifier and the second amplifier are involved in setting the amplifier output.

According to a second aspect of the present invention, an exemplary envelope tracking supply modulator is disclosed. The exemplary envelope tracking supply modulator includes a linear amplifier. The linear amplifier includes a pre-driver stage circuit and an output stage circuit. The pre-driver stage circuit is arranged to receive an envelope input, and generate a pre-driver output according to the envelope input. The output stage circuit is arranged to receive the pre-driver output, and generate an amplifier output according to the pre-driver output, wherein the amplifier output is involved in setting a modulated supply voltage of a power amplifier. The output stage circuit has a plurality of amplifiers, and is arranged to select one or more amplifiers from the plurality of amplifiers for generating the amplifier output, wherein a number of amplifiers selected from the plurality of amplifiers and involved in setting the amplifier output under a first condition that the power amplifier has a first output power level is smaller than a number of amplifiers selected from the plurality of amplifiers and involved in setting the amplifier output under a second condition that the power amplifier has a second output power level that is different from the first output power level.

According to a third aspect of the present invention, an exemplary wireless communication system is disclosed. The exemplary wireless communication system includes a transmit (TX) circuit, an envelope tracking circuit, and a modulator/demodulator circuit. The TX circuit is arranged to receive a TX baseband signal, generate a radio-frequency (RF) signal according to the TX baseband signal, and output the RF signal via a power amplifier. The envelope tracking circuit is arranged to derive an envelope input from the TX baseband signal, and generate a modulated supply voltage according to the envelope input. The envelope tracking circuit includes an envelope tracking supply modulator. The envelope tracking supply modulator includes a linear amplifier. The linear amplifier includes a pre-driver stage circuit and an output stage circuit. The pre-driver stage circuit is arranged to receive the envelope input, and generate a pre-driver output according to the envelope input. The output stage circuit is arranged to receive the pre-driver output, and generate an amplifier output of the linear amplifier according to the pre-driver output, wherein the amplifier output is involved in setting the modulated supply voltage of the power amplifier. The output stage circuit has a plurality of amplifiers, including a first amplifier and a second amplifier. The modulator/demodulator circuit is arranged to generate the TX baseband signal, generate a control signal according to an output power level of the power amplifier, and output the control signal to the output stage circuit. The modulator/demodulator circuit comprises a TX power detection circuit arranged to detect the output power level of the power amplifier. In response to the control signal, the output stage circuit is arranged to select one or more amplifiers from the plurality of amplifiers for generating the amplifier output. When the power amplifier has a first output power level, the first amplifier is involved in setting the amplifier output, and the second amplifier is not involved in setting the amplifier output. When the power amplifier has a second output power level different from the first output power level, the first amplifier and the second amplifier are involved in setting the amplifier output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
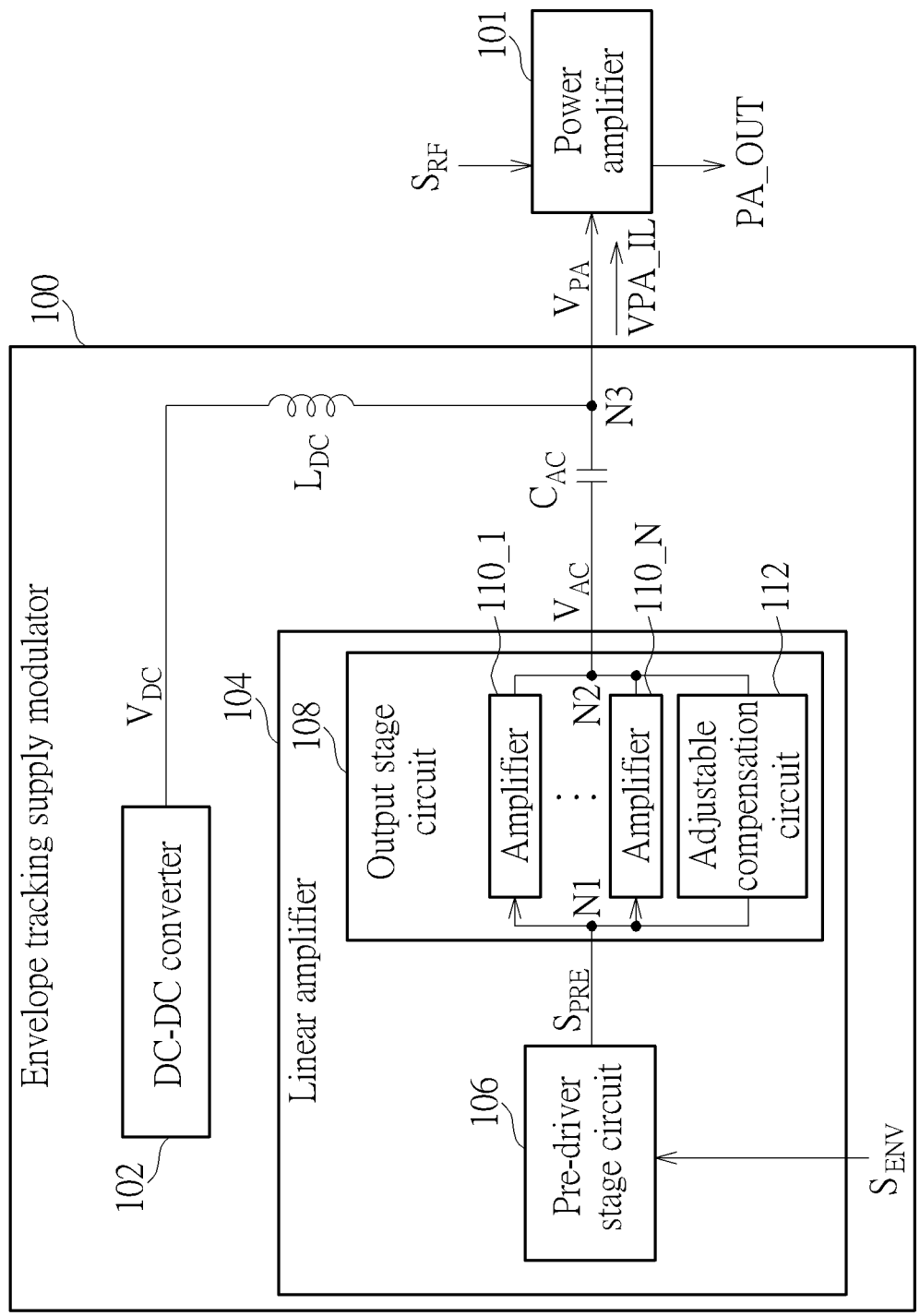
FIG. 1 is a block diagram illustrating an envelope tracking supply modulator according to an embodiment of the present invention.

FIG. 1 is a block diagram illustrating an envelope tracking supply modulator (ETSM) according to an embodiment of the present invention. The ETSM 100 is arranged to generate a modulated supply voltage $V_{PA}$ according to an envelope input $S_{ENV}$, and provide the modulated supply voltage $V_{PA}$ to a power amplifier (PA) 101. The PA 101 is powered by the modulated supply voltage $V_{PA}$ for amplifying a radio-frequency (RF) signal $S_{RF}$ to generate an output PA_OUT with the desired TX power. In this embodiment, the ETSM 100 employs hybrid ETSM architecture, and includes a DC-DC converter 102 and a linear amplifier (LA) 104. The DC-DC converter 102 is arranged to generate and output a regulated direct current (DC) voltage $V_{DC}$ to an output port N3 of the ETSM 100 via an inductor $L_{DC}$. For example, the DC-DC converter 102 may be implemented by a buck converter. The LA 104 is arranged to receive an envelope input $S_{ENV}$, and generate an amplifier output $V_{AC}$ to the output port N3 of the ETSM 100 via an alternating current (AC) coupling capacitor $C_{AC}$. The regulated DC voltage $V_{DC}$ and the amplifier output $V_{AC}$ jointly control the modulated supply voltage $V_{PA}$ of the PA 101. Specifically, the regulated voltage $V_{DC}$ decides a DC part of the modulated supply voltage $V_{PA}$, and the amplifier output $V_{AC}$ decides an AC part of the modulated supply voltage $V_{PA}$.

Figure 2:
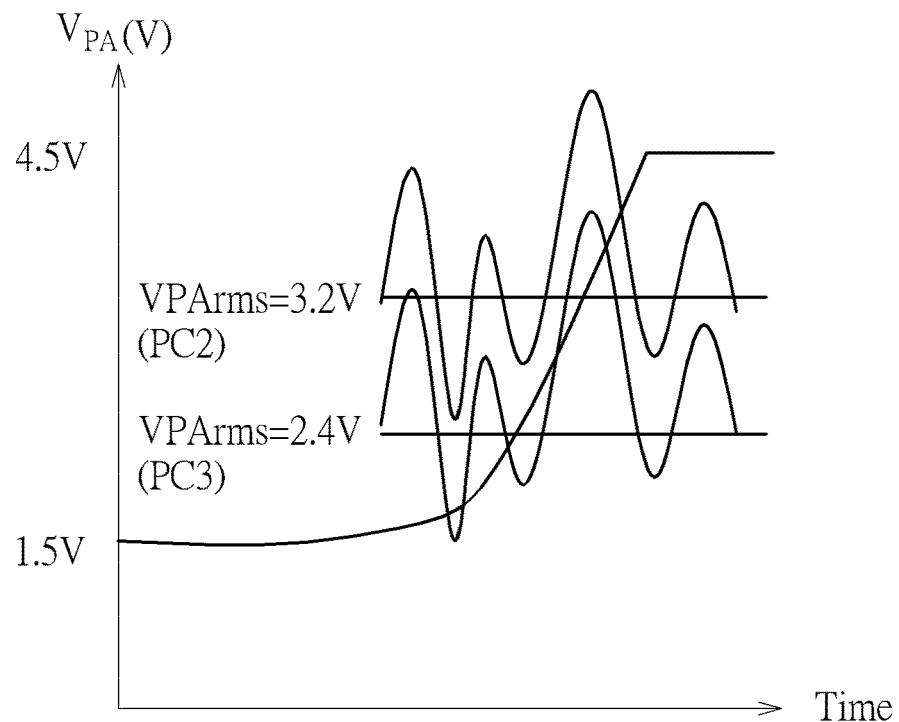
FIG. 2 is a diagram illustrating waveforms of the modulated supply voltage under different power modes of the power amplifier according to an embodiment of the present invention.

FIG. 2 is a diagram illustrating waveforms of the modulated supply voltage $V_{PA}$ under different power modes of the PA 101 according to an embodiment of the present invention. When the PA 101 operates under a high power mode PC2 (Power class 2), the DC part VPArms (VPArms=3.2V) of the modulated supply voltage $V_{PA}$ is set via the regulated DC voltage $V_{DC}$, and the AC part of the modulated supply voltage $V_{PA}$ is set via the amplifier output $V_{AC}$. When the PA 101 operates under a lower power mode PC3 (Power class 3), the DC part VPArms (VPArms=2.4V) of the modulated supply voltage $V_{PA}$ is set via the regulated DC voltage $V_{DC}$, and the AC part of the modulated supply voltage $V_{PA}$ is set via the amplifier output $V_{AC}$.

The LA 104 includes a pre-driver stage circuit 106 and an output stage circuit 108. The pre-driver stage circuit 106 is arranged to receive the envelope input $S_{ENV}$, and generate a pre-driver output $S_{PRE}$ according to the envelope input $S_{ENV}$. The pre-driver stage circuit 106 may be implemented using any available pre-driver design. Since the present invention focuses on the output stage design, further description of the pre-driver stage circuit 106 is omitted here for brevity.

It should be noted that, for brevity and simplicity, only the components pertinent to the present invention are shown in FIG. 1. In practice, the ETSM 100 may include additional component(s), depending upon actual design considerations. For example, the DC-DC converter 102 and the LA 104 form an envelope tracking modulator (ETM), and the envelope input $S_{ENV}$ is provided to the ETM (particularly, LA 104) through an analog filter (not shown) in the ETSM 100.

As mentioned above, a typical wide-bandwidth envelope tracking design is power-hungry due to large quiescent current needed. To address this issue, the present invention proposes an envelope tracking supply modulator using a linear amplifier with a segmented output stage. As shown in FIG. 1, the output stage circuit 108 includes a plurality of amplifiers 110_1-110_N each coupled between an input port N1 and an output port N2 of the output stage circuit 108, where N is a positive integer not smaller than 1 (i.e. N≥2). For example, the output stage circuit 108 may be designed to have only two amplifiers 110_1 and 110_N (N=2). For another example, the output stage circuit 108 may be designed to have more than two amplifiers 110_1-110_N (N>2). To put it simply, the output stage circuit 108 may be regarded as being segmented into multiple amplifiers, where the number of amplifiers may be adjusted, depending upon actual design considerations.

Figure 3:
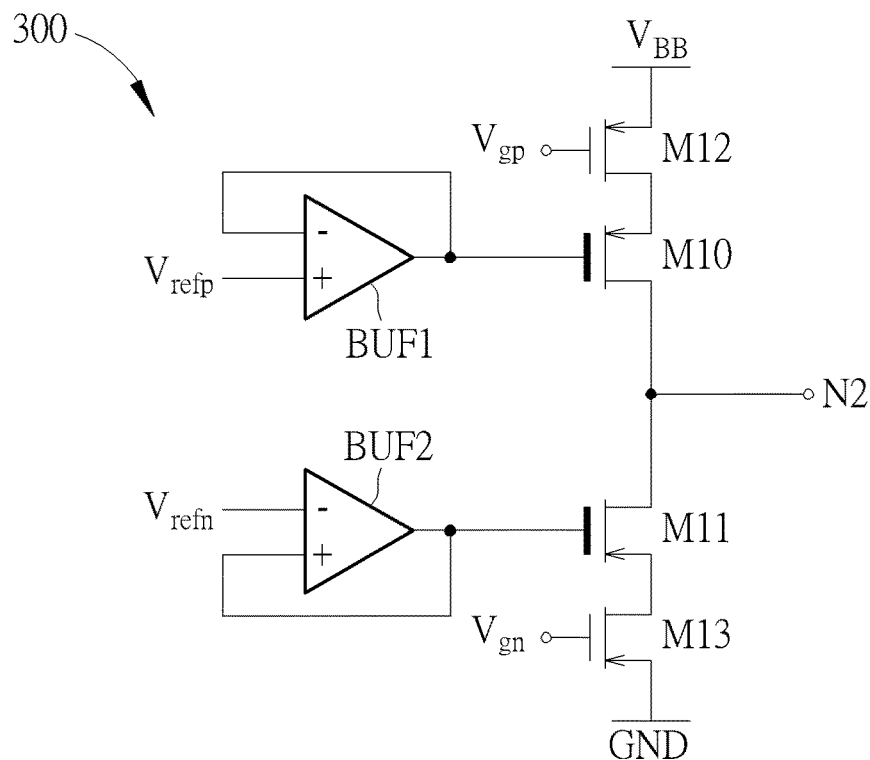
FIG. 3 is a circuit diagram illustrating a class-AB amplifier used by the output stage circuit according to an embodiment of the present invention.

In this embodiment, each of the amplifiers 110_1-110_N may be implemented by a class-AB amplifier. FIG. 3 is a circuit diagram illustrating a class-AB amplifier used by the output stage circuit 108 according to an embodiment of the present invention. The class-AB amplifier design shown in FIG. 3 may be employed to implement one or more of the amplifiers 110_1-110_N. The class-AB amplifier 300 operates under a supply voltage $V_{BB}$ and a ground voltage GND, and includes a plurality of P-type metal oxide semiconductor (PMOS) transistors M10 and M12, a plurality of N-type metal oxide semiconductor (NMOS) transistors M11 and M13, and a plurality of buffers BUF1 and BUF2. In this embodiment, the PMOS transistor M12 and the NMOS transistor M13 are core devices with thin gate oxide, and the PMOS transistor M10 and the NMOS transistor M11 are input/output (I/O) devices with thick gate oxide. The pre-driver output $S_{PRE}$ supplied to the input port N1 of the output stage circuit 108 is a differential signal consisting of $V_{gp}$ and $V_{gn}$. Hence, the input port N1 of the output stage circuit 108 includes a first node and a second node, where the first node is coupled to a gate electrode of the PMOS transistor M12, and the second node is coupled to a gate electrode of the NMOS transistor M13. A gate voltage of the PMOS transistor M10 is set by one reference voltage $V_{refp}$ through the buffer BUF1. A gate voltage of the NMOS transistor M11 is set by another reference voltage $V_{refn}$ through the buffer BUF2. A drain electrode of the PMOS transistor M10 and a drain electrode of the NMOS transistor M11 are coupled to the output port N2 of the output stage circuit 108. Hence, when the class-AB amplifier 300 is enabled by the output stage circuit 108, the class-AB amplifier 300 is involved in setting the amplifier output $V_{AC}$ at the output port N2 of the output stage circuit 108 according to the pre-driver output $S_{PRE}$ at the input port N1 of the output stage circuit 108.

It should be noted that the circuit structure shown in FIG. 3 is for illustrative purposes only, and is not meant to be a limitation of the present invention. For example, another class-AB amplifier design may be employed to implement one or more of the amplifiers 110_1-110_N.

In one exemplary segmented output stage implementation, the amplifiers 110_1-110_N may be identical amplifiers, and therefore have the same output drive capability. In another exemplary implementation, the amplifiers 110_1-110_N may be different amplifiers. For example, the amplifiers 110_1-110_N may have the same circuit design but different transistor sizes, and therefore have different output drive capabilities. For another example, the amplifiers 110_1-110_N may have different circuit designs, and therefore have different output drive capabilities.

The amplifier output $V_{AC}$ generated from the output stage circuit 108 is involved in setting the modulated supply voltage $V_{PA}$ of the PA 101. In this embodiment, the output stage circuit 108 selects one or more amplifiers from the amplifiers 110_1-110_N for generating the amplifier output $V_{AC}$. For better understanding of the proposed TX-power based quiescent current reduction technique, the following assumes that the output stage circuit 108 may be designed to have only two amplifiers 110_1 and 110_N (N=2). When the PA 101 has a first output power level, the amplifier 110_1 is involved in setting the amplifier output $V_{AC}$, and the amplifier 110_N (N=2) is not involved in setting the amplifier output $V_{AC}$. When the PA 101 has a second output power level different from the first output power level, the amplifiers 110_1 and 110_N (N=2) are both involved in setting the amplifier output $V_{AC}$. For example, the amplifier 110_N (N=2) is disabled when the PA 101 has the first output power level, and is enabled when the PA 101 has the second output power level higher than the first output power level. Hence, quiescent current of the LA 104 under a first condition that the PA 101 has the first output power level is smaller than quiescent current of the LA 104 under a second condition that the PA 101 has the second output power level higher than the first output power level. In this way, the efficiency of the ETSM 100 can be improved for mid-range and low TX power.

Figure 4:
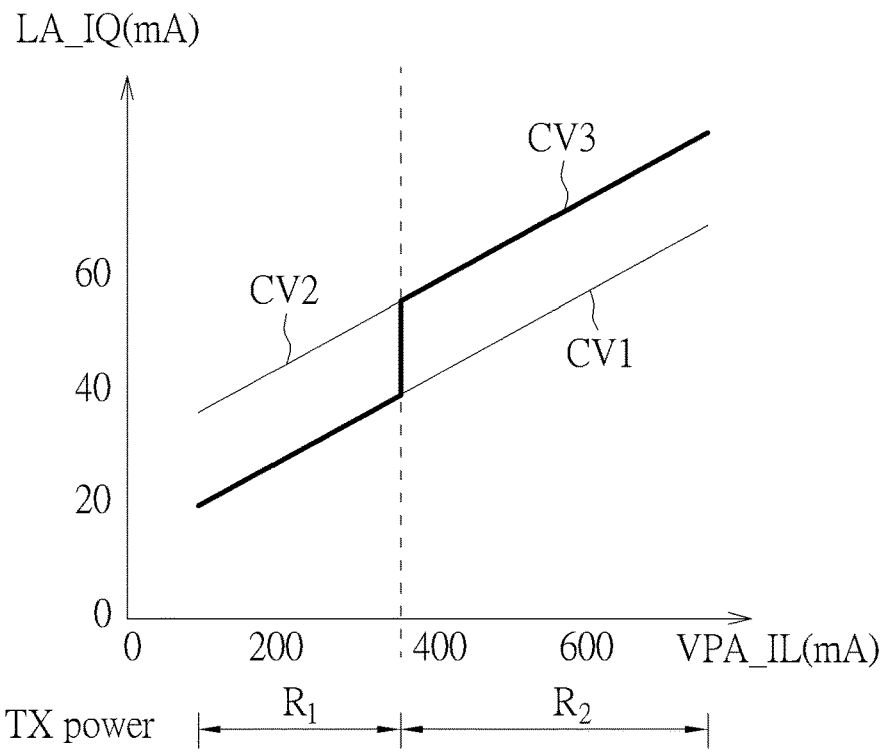
FIG. 4 is a diagram illustrating the relationship between quiescent current of the linear amplifier (which has only two amplifiers in its output stage) and load current of the power amplifier according to an embodiment of the present invention.

FIG. 4 is a diagram illustrating the relationship between quiescent current LA_IQ of the LA 104 (which has only two amplifiers in its output stage) and load current VPA_IL of the PA 101 according to an embodiment of the present invention. The quiescent current LA_IQ of the LA 104 is dominated by transistors. The load current VPA_IL of the PA 101 is positively correlated with the output power level of the PA 101. The TX power of the PA 101 is segmented into two non-overlapping output power ranges $R_1$ and $R_2$, where a maximum output power level within the output power range $R_1$ is lower than a minimum output power level within the output power range $R_2$.

The characteristic curve CV1 represents the relationship between load current VPA_IL of the PA 101 and quiescent current LA_IQ of the LA 104 under a condition that the LA 104 uses only one amplifier 110_1 for generating the amplifier output $V_{AC}$. The characteristic curve CV2 represents the relationship between load current VPA_IL of the PA 101 and quiescent current LA_IQ of the LA 104 under a condition that the LA 104 uses all amplifiers 110_1 and 110_N (N=2) for generating the amplifier output $V_{AC}$. When the proposed TX-power based quiescent current reduction technique is used, the characteristic curve CV3 can be obtained. The characteristic curve CV3 represents the relationship between load current VPA_IL of the PA 101 and quiescent current LA_IQ of the LA 104 under a condition that the LA 104 has only one amplifier 110_1 enabled and involved in setting the amplifier output $V_{AC}$ for an arbitrary output power level within the output power range $R_1$, and has all amplifiers 110_1 and 110_N (N=2) enabled and involved in setting the amplifier output $V_{AC}$ for an arbitrary output power level within the output power range $R_2$.

When an output power level of the PA 101 is any of the output power levels belonging to the output power range $R_1$ (e.g. PA 101 operates in a low power mode), the amplifier 110_1 is enabled and the amplifier 110_N (N=2) is disabled, such that only one of the amplifiers 110_1 and 110_N (N=2) is involved in setting the amplifier output $V_{AC}$ that contributes to the modulated supply voltage $V_{PA}$. When an output power level of the PA 101 is any of the output power levels belonging to the output power range $R_2$ (e.g. PA 101 operates in a high power mode), the amplifiers 110_1 and 110_N (N=2) are both enabled and involved in setting the amplifier output $V_{AC}$ that contributes to the modulated supply voltage $V_{PA}$. The quiescent current of the LA 104 is reduced when the TX power level is low. Therefore, the ETSM efficiency can be improved for mid-range and low TX power.

Figure 5:
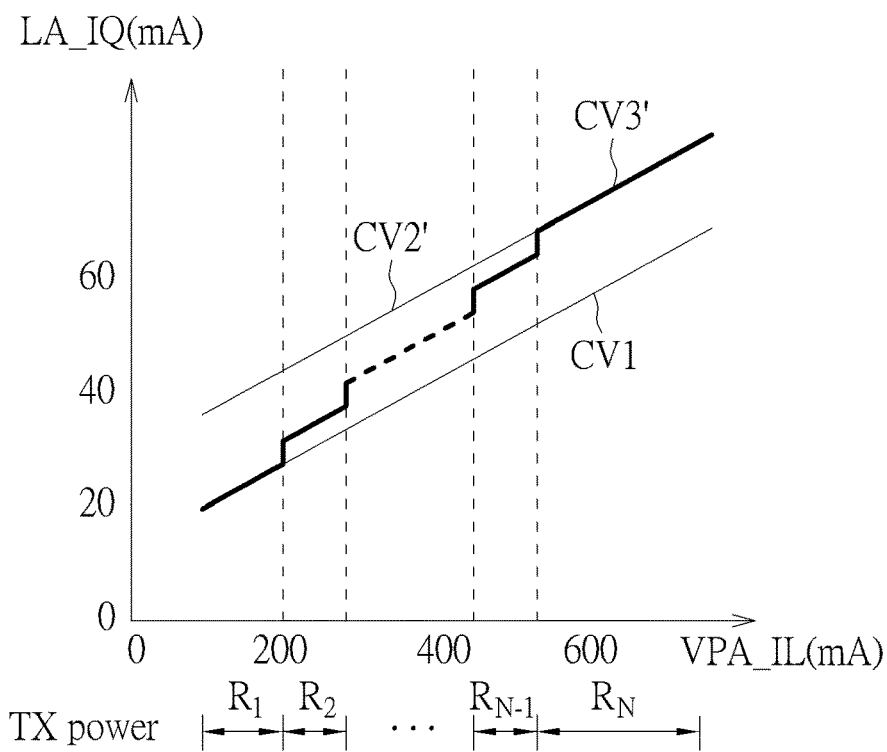
FIG. 5 is a diagram illustrating the relationship between quiescent current of the linear amplifier (which has more than two amplifiers in its output stage) and load current of the power amplifier according to an embodiment of the present invention.

Alternatively, the output stage circuit 108 may be designed to have more than two amplifiers 110_1-110_N (N>2). The same concept of using a segmented output stage for LA quiescent current reduction and ETSM efficiency improvement can be applied. FIG. 5 is a diagram illustrating the relationship between quiescent current LA_IQ of the LA 104 (which has more than two amplifiers in its output stage) and load current VPA_IL of the PA 101 according to an embodiment of the present invention. The TX power of the PA 101 is segmented into N non-overlapping output power ranges $R_1, R_2, \ldots, R_{N-1}, R_N$, where a maximum output power level within the output power range $R_1$ is lower than a minimum output power level within the output power range $R_2$, a maximum output power level within the output power range $R_2$ is lower than a minimum output power level within a higher output power range, and so on.

The characteristic curve CV1 represents the relationship between load current VPA_IL of the PA 101 and quiescent current LA_IQ of the LA 104 under a condition that the LA 104 uses only one amplifier 110_1 for generating the amplifier output $V_{AC}$. The characteristic curve CV2' represents the relationship between load current VPA_IL of the PA 101 and quiescent current LA_IQ of the LA 104 under a condition that the LA 104 uses all amplifiers 110_1-110_N (N>2) for generating the amplifier output $V_{AC}$. When the proposed TX-power based quiescent current reduction technique is used, the characteristic curve CV3' can be obtained. The characteristic curve CV3' represents the relationship between load current VPA_IL of the PA 101 and quiescent current LA_IQ of the LA 104 under a condition that the LA 104 has different combinations of amplifiers that are enabled and involved in setting the amplifier output $V_{AC}$ for different output power ranges $R_1$-$R_N$ of the PA 101, respectively. For example, when an output power level of the PA 101 is any of the output power levels belonging to the output power range $R_i$ (1≤i≤N), the amplifiers 110_1-110_i are enabled and involved in setting the amplifier output $V_{AC}$ that contributes to the modulated supply voltage $V_{PA}$, while the amplifiers 110_(i+1)-110_N are disabled and not involved in setting the amplifier output $V_{AC}$.

To put it another way, in response to an output power level of the PA 101, the output stage circuit 108 selects one or more amplifiers from the amplifiers 110_1-110_N for generating the amplifier output $V_{AC}$. For example, the number of amplifiers selected from amplifiers 110_1-110_N and involved in setting the amplifier output $V_{AC}$ under a first condition that the PA 101 has a first output power level is smaller than the number of amplifiers selected from amplifiers 110_1-110_N and involved in setting the amplifier output $V_{AC}$ under a second condition that the PA 101 has a second output power level that is different from (e.g. higher than) the first output power level.

Figure 6:
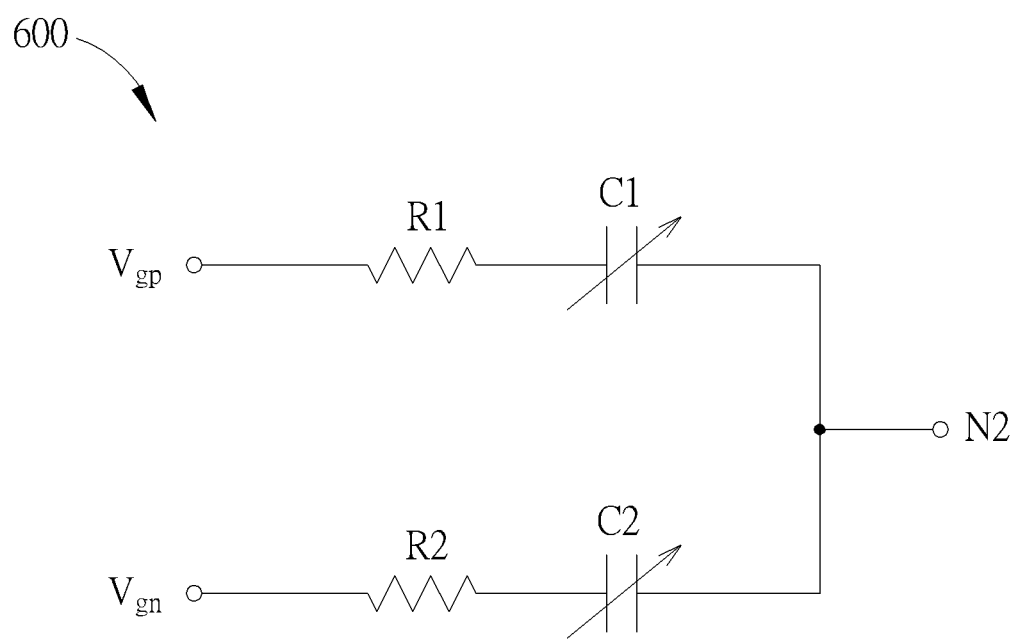
FIG. 6 is a circuit diagram illustrating an adjustable compensation circuit according to an embodiment of the present invention.

In addition to the amplifiers 110_1-110_N, the output stage circuit 108 may include an adjustable compensation circuit 112 that is arranged to change its compensation setting when the selection of amplifiers involved in setting the amplifier output $V_{AC}$ changes due to the output power level change of the PA 101. FIG. 6 is a circuit diagram illustrating an adjustable compensation circuit according to an embodiment of the present invention. By way of example, but not limitation, the adjustable compensation circuit 112 shown in FIG. 1 may be implemented by the adjustable compensation circuit 600 shown in FIG. 6. The adjustable compensation circuit 600 is coupled between the input port N1 and the output port N2 of the output stage circuit 108, and includes a plurality of resistors R1, R2 and a plurality of variable capacitors C1, C2. The pre-driver output $S_{PRE}$ supplied to the input port N1 of the output stage circuit 108 is a differential signal consisting of $V_{gp}$ and $V_{gn}$. Hence, the input port N1 of the output stage circuit 108 includes a first node and a second node, where the first node is coupled to one end of the resistor R1, and the second node is coupled to one end of the resistor R2. The capacitance values of the variable capacitors C1 and C2 can be dynamically adjusted to change the compensation setting of the adjustable compensation circuit 600. For example, when the PA 101 has the first output power level, the adjustable compensation circuit 600 is configured to have a first compensation setting optimized for the output stage circuit 108. When the PA 101 has the second output power, the adjustable compensation circuit 600 is configured to have a second compensation setting optimized for the output stage circuit 108, where the second compensation setting is different from the first compensation setting due to capacitance adjustment made via variable capacitors C1 and C2.

It should be noted that the adjustable compensation circuit 112 may be optional. For example, the output stage circuit 108 may be modified to have the adjustable compensation circuit 112 replaced with a compensation circuit with a fixed compensation setting. Any envelope tracking supply modulator using a linear amplifier with a segmented output stage falls within the scope of the present invention.

Figure 7:
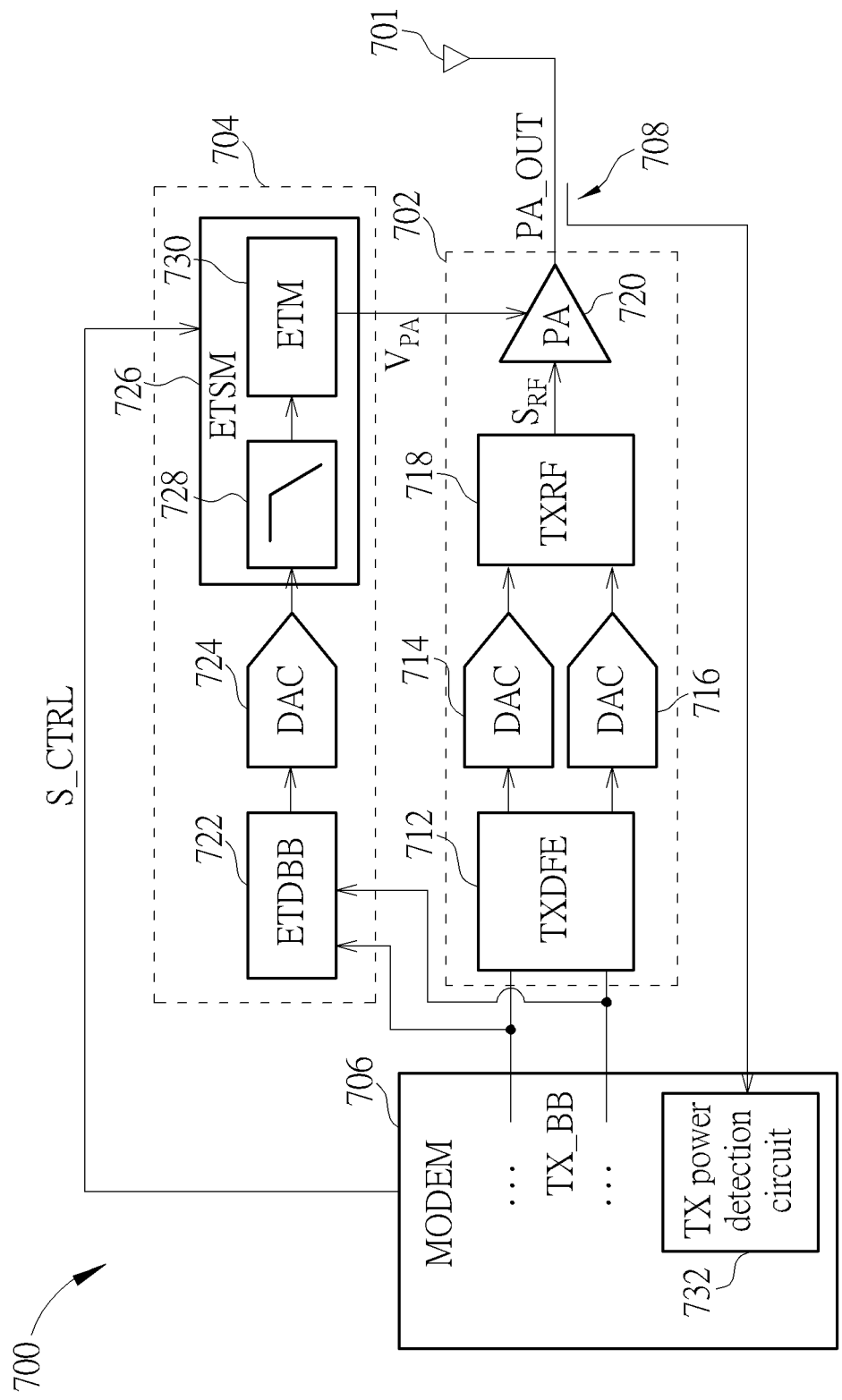
FIG. 7 is a block diagram illustrating a wireless communication system according to an embodiment of the present invention.

FIG. 7 is a block diagram illustrating a wireless communication system according to an embodiment of the present invention. For example, the wireless communication system 700 may be a 5G-NR system or a 4G-LTE system, and an envelope tracking supply modulator of the wireless communication system 700 may have a digitally controlled linear amplifier with a segmented output stage for RF transmitter efficiency optimization. As shown in FIG. 7, the wireless communication system 700 includes a transmit (TX) circuit 702, an envelope tracking circuit 704, and a modulator/demodulator circuit (labeled as "MODEM") 706. The modulator/demodulator circuit 706 may be a part of a digital baseband circuit. The TX circuit 302 is arranged to receive a TX baseband signal TX_BB from the modulator/demodulator circuit 702, generate a radio-frequency (RF) signal $S_{RF}$ according to the TX baseband signal TX_BB, and output the RF signal $S_{RF}$ to an antenna 701 via a power amplifier (PA) 720. For example, the TX baseband signal TX_BB is a digital signal, the RF signal $S_{RF}$ is an analog signal, and the TX circuit 702 includes a TX digital front end circuit (labeled as "TXDFE") 712, a digital-to-analog converter (DAC) 714 (in-phase (I) path), a digital-to-analog converter (DAC) 716 (quadrature (Q) path), an RF circuit (labeled as "TXRF") 718, and the PA 720. The TX digital front end circuit 712 may include a digital pre-distortion block, an upsampling block (I-path), an upsampling block (Q-path), etc. The RF circuit 718 may include an analog filter (I-path), an analog filter (Q-path), an upconverter, etc.

The envelope tracking circuit 704 is arranged to derive an envelope input $S_{ENV}$ from the baseband signal TX_BB, and generate a modulated supply voltage $V_{PA}$ according to the envelope input $S_{ENV}$. For example, the TX baseband signal TX_BB is a digital signal, the envelope input $S_{ENV}$ is an analog signal, and the envelope tracking circuit 704 includes an envelope tracking digital baseband circuit (labeled as "ETDBB") 722, a DAC 724, and an envelope tracking supply modulator (ETSM) 726, where the ETSM 726 includes an analog filter 728 and an envelope tracking modulator (ETM) 730. The envelope tracking digital baseband circuit 722 may include an envelope detection block, a power scaling block, a lookup table, an upsampling block, etc.

The PA 720 shown in FIG. 7 may be the PA 101 shown in FIG. 1. The ETSM 726 (particularly, ETM 730) may be implemented by using the hybrid ETSM architecture shown in FIG. 1. Hence, the ETM 730 may include the DC-DC converter 102 and the linear amplifier 104 shown in FIG. 1. In this embodiment, the ETSM 726 can be automatically adjusted according to digital detection of the TX power level for system efficiency optimization. As shown in FIG. 7, the modulator/demodulator circuit 706 includes a TX power detection circuit 732 arranged to perform digital detection of the TX power level. The TX power detection circuit 732 may receive an output PA_OUT of the PA 720 via a coupler 708 and a receive (RX) path, and may detect the output power level of the PA 720 (i.e. TX power of the wireless communication system 700), for example, by processing the output PA_OUT in a digital domain. The modulator/demodulator circuit 706 generates a control signal S_CTRL according to the detected output power level of the PA 720, and outputs the control signal S_CTRL to the ETSM 726 (particularly, output stage circuit 108 of LA 104). In response to the control signal S_CTRL, the output stage circuit 108 selects one or more amplifiers from the amplifiers 110_1-110_N for generating the amplifier output $V_{AC}$, and/or configures the compensation setting of the adjustable compensation circuit 112.

Figure 8:
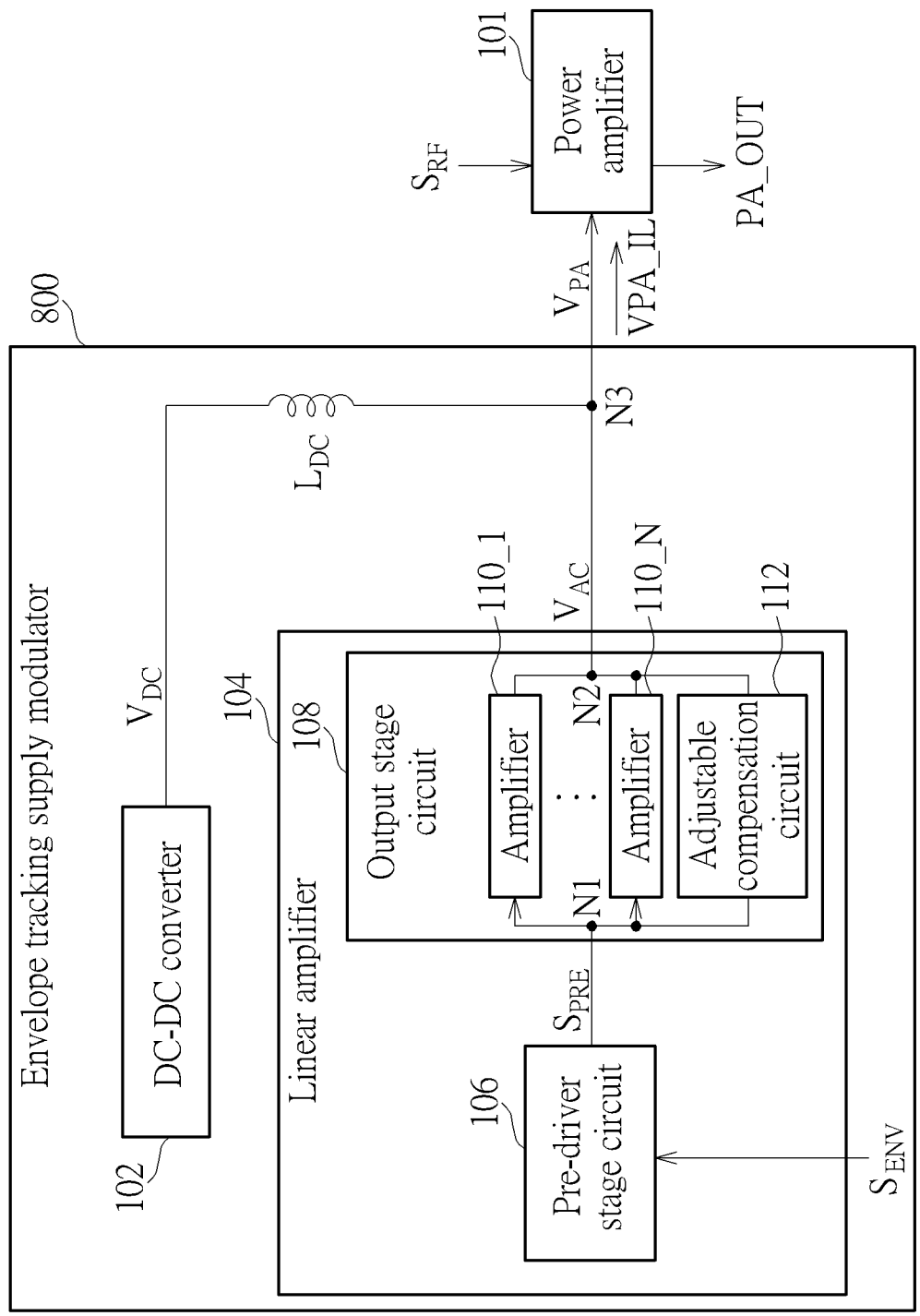
FIG. 8 is a block diagram illustrating another envelope tracking supply modulator according to an embodiment of the present invention.

In the embodiment shown in FIG. 1, the ETSM 100 has the LA 104 coupled to the output port N3 through the AC coupling capacitor $C_{AC}$. However, this is for illustrative purposes only, and is not meant to be a limitation of the present invention. FIG. 8 is a block diagram illustrating another envelope tracking supply modulator according to an embodiment of the present invention. The major difference between ETSMs 800 and 100 is that the ETSM 800 has the LA 108 coupled to the output port N3 without via any AC coupling capacitor. In other words, the amplifier output $V_{AC}$ is direct current (DC) coupled to the output port N3. The same objective of using the regulated DC voltage $V_{DC}$ and the amplifier output $V_{AC}$ to jointly control the modulated supply voltage $V_{PA}$ of the PA 101 is achieved. Since a person skilled in the art can readily understand details of the ETSM 800 after reading above paragraphs directed to the ETSM 100, further description is omitted here for brevity. Furthermore, regarding the wireless communication system 700 shown in FIG. 7, the ETSM 726 (particularly, ETM 730) may be implemented by using the hybrid ETSM architecture shown in FIG. 8. Hence, the ETM 730 may include the DC-DC converter 102 and the linear amplifier 104 shown in FIG. 8.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An envelope tracking supply modulator comprising:
    a linear amplifier, comprising:
        a pre-driver stage circuit, arranged to receive an envelope input, and generate a pre-driver output according to the envelope input; and
        an output stage circuit, arranged to receive the pre-driver output, and generate an amplifier output of the linear amplifier according to the pre-driver output, wherein the amplifier output is involved in setting a modulated supply voltage of a power amplifier, and the output stage circuit comprises:
            a plurality of amplifiers, comprising a first amplifier and a second amplifier, wherein when the power amplifier has a first output power level, the first amplifier is involved in setting the amplifier output, and the second amplifier is not involved in setting the amplifier output; and when the power amplifier has a second output power level different from the first output power level, the first amplifier and the second amplifier are involved in setting the amplifier output;
    wherein quiescent current of the linear amplifier under a first condition that the power amplifier has the first output power level is different from quiescent current of the linear amplifier under a second condition that the power amplifier has the second output power level.

2. The envelope tracking supply modulator of claim 1, wherein the second output power level is higher than the first output power level.

3. The envelope tracking supply modulator of claim 1, wherein the first output power level is lower than the second output power level, and the quiescent current of the linear amplifier under the first condition is smaller than the quiescent current of the linear amplifier under the second condition.

4. The envelope tracking supply modulator of claim 1, wherein the first output power level is an arbitrary value among a plurality of output power levels within a first output power range of the power amplifier, the second output power level is an arbitrary value among a plurality of output power levels within a second output power range of the power amplifier, and the first output power range does not overlap the second output power range.

5. The envelope tracking supply modulator of claim 1, wherein when the power amplifier has the first output power level, the second amplifier is disabled; and when the power amplifier has the second output power level, the second amplifier is enabled.

6. The envelope tracking supply modulator of claim 1, wherein the first amplifier and the second amplifier are identical amplifiers.

7. The envelope tracking supply modulator of claim 1, wherein the first amplifier and the second amplifier are different amplifiers.

8. The envelope tracking supply modulator of claim 1, wherein the pre-driver output is received at an input port of the output stage circuit, the amplifier output is generated at an output port of the output stage circuit, and the output stage circuit further comprises:
    an adjustable compensation circuit, coupled between the output port and the input port of the output stage circuit, wherein when the power amplifier has the first output power level, the adjustable compensation circuit is configured to have a first compensation setting; and when the power amplifier has the second output power, the adjustable compensation circuit is configured to have a second compensation setting different from the first compensation setting.

9. The envelope tracking supply modulator of claim 1, wherein the modulated supply voltage of the power amplifier is generated at an output port of the envelope tracking supply modulator, and the output stage circuit outputs the amplifier output to the output port of the envelope tracking supply modulator without via any alternating current (AC) coupling capacitor.

10. An envelope tracking supply modulator comprising:
    a linear amplifier, comprising:
        a pre-driver stage circuit, arranged to receive an envelope input, and generate a pre-driver output according to the envelope input; and
        an output stage circuit, arranged to receive the pre-driver output, and generate an amplifier output according to the pre-driver output, wherein the amplifier output is involved in setting a modulated supply voltage of a power amplifier, and the output stage circuit comprises:
            a plurality of amplifiers, wherein the output stage circuit is arranged to select one or more amplifiers from the plurality of amplifiers for generating the amplifier output, and a number of amplifiers selected from the plurality of amplifiers and involved in setting the amplifier output under a first condition that the power amplifier has a first output power level is smaller than a number of amplifiers selected from the plurality of amplifiers and involved in setting the amplifier output under a second condition that the power amplifier has a second output power level that is different from the first output power level;
wherein quiescent current of the linear amplifier under the first condition is different from quiescent current of the linear amplifier under the second condition.

11. The envelope tracking supply modulator of claim 10, wherein the first output power level is lower than the second output power level.

12. The envelope tracking supply modulator of claim 10, wherein the first output power level is lower than the second output power level, and the quiescent current of the linear amplifier under the first condition is smaller than the quiescent current of the linear amplifier under the second condition.

13. The envelope tracking supply modulator of claim 10, wherein the first output power level is an arbitrary value among a plurality of output power levels within a first output power range of the power amplifier, the second output power level is an arbitrary value among a plurality of output power levels within a second output power range of the power amplifier, and the first output power range does not overlap the second output power range.

14. The envelope tracking supply modulator of claim 10, wherein the plurality of amplifiers are identical amplifiers.

15. The envelope tracking supply modulator of claim 10, wherein the plurality of amplifiers are different amplifiers.

16. The envelope tracking supply modulator of claim 10, wherein the pre-driver output is received at an input port of the output stage circuit, the amplifier output is generated at an output port of the output stage circuit, and the output stage circuit further comprises:
an adjustable compensation circuit, coupled between the output port and the input port of the output stage circuit, wherein when the power amplifier has the first output power level, the adjustable compensation circuit is configured to have a first compensation setting; and when the power amplifier has the second output power, the adjustable compensation circuit is configured to have a second compensation setting different from the first compensation setting.

17. The envelope tracking supply modulator of claim 10, wherein the modulated supply voltage of the power amplifier is generated at an output port of the envelope tracking supply modulator, and the output stage circuit outputs the amplifier output to the output port of the envelope tracking supply modulator without via any alternating current (AC) coupling capacitor.

18. A wireless communication system comprising:
a transmit (TX) circuit, arranged to receive a TX baseband signal, generate a radio-frequency (RF) signal according to the TX baseband signal, and output the RF signal via a power amplifier;
an envelope tracking circuit, arranged to derive an envelope input from the TX baseband signal, and generate a modulated supply voltage according to the envelope input, wherein the envelope tracking circuit comprises an envelope tracking supply modulator, and the envelope tracking supply modulator comprises:
a linear amplifier, comprising:
a pre-driver stage circuit, arranged to receive the envelope input, and generate a pre-driver output according to the envelope input; and
an output stage circuit, arranged to receive the pre-driver output, and generate an amplifier output of the linear amplifier according to the pre-driver output, wherein the amplifier output is involved in setting the modulated supply voltage of the power amplifier, and the output stage circuit comprises:
a plurality of amplifiers, comprising a first amplifier and a second amplifier; and
a modulator/demodulator circuit, arranged to generate the TX baseband signal, generate a control signal according to an output power level of the power amplifier, and output the control signal to the output stage circuit, wherein the modulator/demodulator circuit comprises:
a TX power detection circuit, arranged to detect the output power level of the power amplifier;
wherein in response to the control signal, the output stage circuit is arranged to select one or more amplifiers from the plurality of amplifiers for generating the amplifier output; when the power amplifier has a first output power level, the first amplifier is involved in setting the amplifier output, and the second amplifier is not involved in setting the amplifier output; when the power amplifier has a second output power level different from the first output power level, the first amplifier and the second amplifier are involved in setting the amplifier output and quiescent current of the linear amplifier under a first condition that the power amplifier has the first output power level is different from quiescent current of the linear amplifier under a second condition that the power amplifier has the second output power level.

19. The wireless communication system of claim 18, wherein a number of amplifiers selected from the plurality of amplifiers and involved in setting the amplifier output under the first condition that the power amplifier has the first output power level is different from a number of amplifiers selected from the plurality of amplifiers and involved in setting the amplifier output under the second condition that the power amplifier has the second output power level.

20. The wireless communication system of claim 18, wherein the first output power level is lower than the second output power level.

21. The wireless communication system of claim 18, wherein the modulated supply voltage of the power amplifier is generated at an output port of the envelope tracking supply modulator, and the output stage circuit outputs the amplifier output to the output port of the envelope tracking supply modulator without via any alternating current (AC) coupling capacitor.

* * * * *